United States Patent
Chen et al.

(10) Patent No.: US 6,780,741 B2
(45) Date of Patent: Aug. 24, 2004

(54) METHOD OF FORMING A NOVEL GATE ELECTRODE STRUCTURE COMPRISED OF A SILICON-GERMANIUM LAYER LOCATED BETWEEN RANDOM GRAINED POLYSILICON LAYERS

(75) Inventors: Chia-Lin Chen, Hsinchu (TW); Liang-Gi Yao, Hsing-Chu (TW); Shih-Chang Chen, Taoyuan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 10/338,155

(22) Filed: Jan. 8, 2003

(65) Prior Publication Data
US 2004/0132270 A1 Jul. 8, 2004

(51) Int. Cl.[7] .......................................... H01L 21/3205
(52) U.S. Cl. ........................ 438/592; 438/658; 438/660
(58) Field of Search ................................ 438/308, 592, 438/652, 657, 658, 660

(56) References Cited

U.S. PATENT DOCUMENTS

| | | | | |
|---|---|---|---|---|
| 5,441,904 A | * | 8/1995 | Kim et al. | 438/592 |
| 5,633,177 A | | 5/1997 | Anjum | 438/301 |
| 5,817,547 A | * | 10/1998 | Eom | 438/660 |
| 5,998,289 A | | 12/1999 | Sagnes | 438/592 |
| 6,153,534 A | | 11/2000 | Long et al. | 438/745 |
| 6,159,810 A | * | 12/2000 | Yang | 438/592 |
| 6,180,499 B1 | | 1/2001 | Yu | 438/585 |
| 6,214,681 B1 | | 4/2001 | Yu | 438/300 |
| 6,373,112 B1 | * | 4/2002 | Murthy et al. | 438/592 |

* cited by examiner

*Primary Examiner*—Chandra Chaudhari
(74) *Attorney, Agent, or Firm*—Haynes and Boone, LLP

(57) ABSTRACT

A method of fabricating a gate structure for a MOSFET device, allowing a reduced polysilicon depletion effect as well as increased carrier mobility to be realized, has been developed. The method features a polysilicon-germanium component of the gate structure, sandwiched between an underlying polysilicon seed layer and an overlying polysilicon cap layer. The inclusion of germanium in the deposited polysilicon-germanium component results in enhanced dopant activation and thus a reduced polysilicon depletion effect. The polysilicon seed and cap layers are subjected to low temperature, anneal procedures, performed in situ in a hydrogen ambient, after deposition of the polysilicon layers. The in situ anneal procedures alters the columnar grains of the polysilicon layers to small, random grains resulting in smooth polysilicon surfaces, with the smooth surface of the polysilicon seed layer interfacing the underlying gate insulator layer resulting in enhanced carrier mobility when compared to counterpart polysilicon seed layer comprised with rough surfaces.

27 Claims, 5 Drawing Sheets

METHOD OF FORMING A NOVEL GATE ELECTRODE STRUCTURE COMPRISED OF A SILICON-GERMANIUM LAYER LOCATED BETWEEN RANDOM GRAINED POLYSILICON LAYERS

BACKGROUND OF THE INVENTION (1) Field of the Invention

The present invention relates to methods used to fabricate semiconductor devices, and more specifically to a method used to form a gate structure for a metal oxide semiconductor field effect transistor (MOSFET) device.

(2) Description of Prior Art

Micro-miniaturization, or the ability to form semiconductor devices with sub-micron features, has allowed the performance of sub-micron MOSFET devices to be increased, while processing costs have decreased. However as dimensions of specific device features decrease specific phenomena, not relevant for devices formed with larger features, become significant. For example gate structures, comprised of polysilicon, can exhibit a polysilicon depletion effect (PED), specifically evident with narrow width polysilicon gate structures. The polysilicon depletion effect entails distribution of the applied voltage across the polysilicon gate structure as well as across the intended region, the underlying gate insulator layer. The PED phenomena thus adversely influences critical device characteristics such as threshold voltage. In addition to the PED phenomena encountered with devices fabricated with sub-micron features, the effect of the surface characteristics of the polysilicon gate structure interfacing the underlying gate insulator layer can also magnified. For example a polysilicon layer deposited on an underlying silicon dioxide gate insulator layer is formed with columnar grains, grains that extend vertically from the silicon dioxide-polysilicon interface throughout the polysilicon layer. This type of grain structure or surface roughness, results in unwanted vertical electric scattering, deleteriously influencing specific device parameters such as carrier mobility. The effect of the columnar grains or surface roughness is more pronounced for devices comprised with sub-micron gate structures.

This invention will describe a process sequence used to form a gate structure in which the polysilicon depletion effect is reduced, in addition to reducing polysilicon surface roughness by altering a columnar grain structure to a smoother randomly grained polysilicon layer. This is accomplished via use of a composite gate structure comprised of a polysilicon-germanium layer, used to reduce PED, sandwiched between layers of polysilicon comprised with random grain structures, which in turn are obtained via the novel procedures described in the present invention. Prior art such as Long et al, in U.S. Pat. No. 6,153,534, Yu, in U.S. Pat. No. 6,214,681 B1, Yu, in U.S. Pat. No. 6,180,499 B1, Sagnes, in U.S. Pat. No. 5,998,289, and Anjum, in U.S. Pat. No. 5,633,177, describe methods of forming gate structures, some comprised with silicon-germanium components, however none describing the novel procedures described in the present invention in which a gate structure is formed comprised of a polysilicon-germanium component, located between random grain polysilicon layers, thus providing reduction in a polysilicon depletion effect, as well as providing enhancement of specific device characteristics.

SUMMARY OF THE INVENTION

It is an object of this invention to form a conductive gate structure for a MOSFET device, comprised of a polysilicon-germanium component, sandwiched between two polysilicon layers.

It is another object of this invention to form the two polysilicon layers with smooth surfaces and comprised with random grains.

It is still another object of this invention to perform a low temperature, hydrogen, in situ anneal after deposition of the polysilicon layers to convert the columnar grains of the polysilicon to smaller, random grains.

In accordance with this invention a method of forming a conductive gate structure for a MOSFET device, comprised of a polysilicon-germanium component located between polysilicon layers, which in turn are comprised with small, random grains, is described. After growth of a silicon dioxide gate insulator layer, a polysilicon seed layer, comprised with columnar grains is deposited. A low temperature, in situ anneal procedure performed in a hydrogen ambient, is then employed to convert the columnar grain polysilicon seed layer to a polysilicon seed layer comprised of smaller, random grains, with the smaller random grain polysilicon layer also presenting smoother surfaces than the columnar grain polysilicon counterpart. Deposition of a polysilicon-germanium layer is next accomplished on the smooth top surface of the random grain polysilicon seed layer. This is followed by deposition of a polysilicon cap layer, again comprised of a columnar grain polysilicon layer, which after subjection to another low temperature, in situ hydrogen anneal procedure, evolves into a small, random grain polysilicon layer, exhibiting smooth surfaces. Photolithographic and dry etching procedures are then employed to define a conductive gate structure comprised of a polysilicon-germanium component sandwiched between two polysilicon layers each comprised with small random grains.

BRIEF DESCRIPTION OF THE DRAWINGS

The object and other advantages of this invention are best described in the preferred embodiment with reference to the attached drawings that include.

DESCRIPTION OF THE PREFERRED EMBODIMENT

Figure 1A:
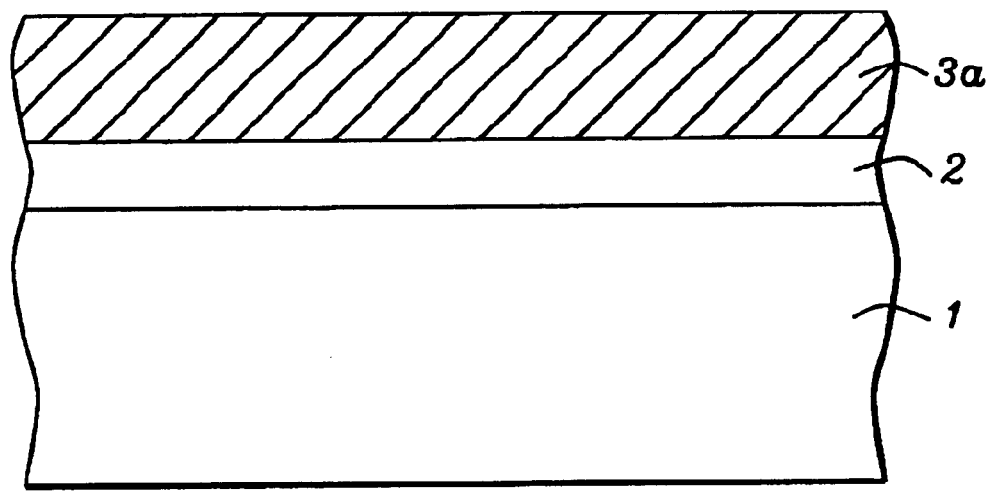
FIGS. 1A, 2A, 3, 4A, 5A, and 6, which schematically in cross-sectional style show key stages used to fabricate a conductive gate structure for a MOSFET device, comprised of a polysilicon-germanium component, located between polysilicon layers which in turn are comprised with small, random grains.

The method of forming a conductive gate structure for a MOSFET device, comprised of a polysilicon-germanium component, located between polysilicon layers which in turn are comprised with small, random grains, will now be described in detail. Semiconductor substrate 1, comprised of single crystalline silicon with a <100>crystallographic orientation, is used and schematically shown on FIG. 1A Gate insulator layer 2, at a thickness between about 17 to 135 Angstroms, is a silicon dioxide layer, thermally grown at a temperature between about 800 to 1100° C., in an oxygen-steam ambient. Polysilicon layer 3a, to be used as a seed layer for deposition of a subsequent overlying layer, is next deposited via low pressure chemical vapor deposition (LPCVD), procedures, at a thickness between about 50 to 300 Angstroms, with the LPCVD procedure performed at a temperature between about 600 to 660° C., using silane, or disilane, and hydrogen as reactants. Polysilicon seed layer 3*a*, can be deposited intrinsically, or doped in situ during deposition, via the addition of arsine, phosphine, or diborane, to the silane ambient. The result of these procedures is schematically shown in FIG. 1A.

Figure 1B:
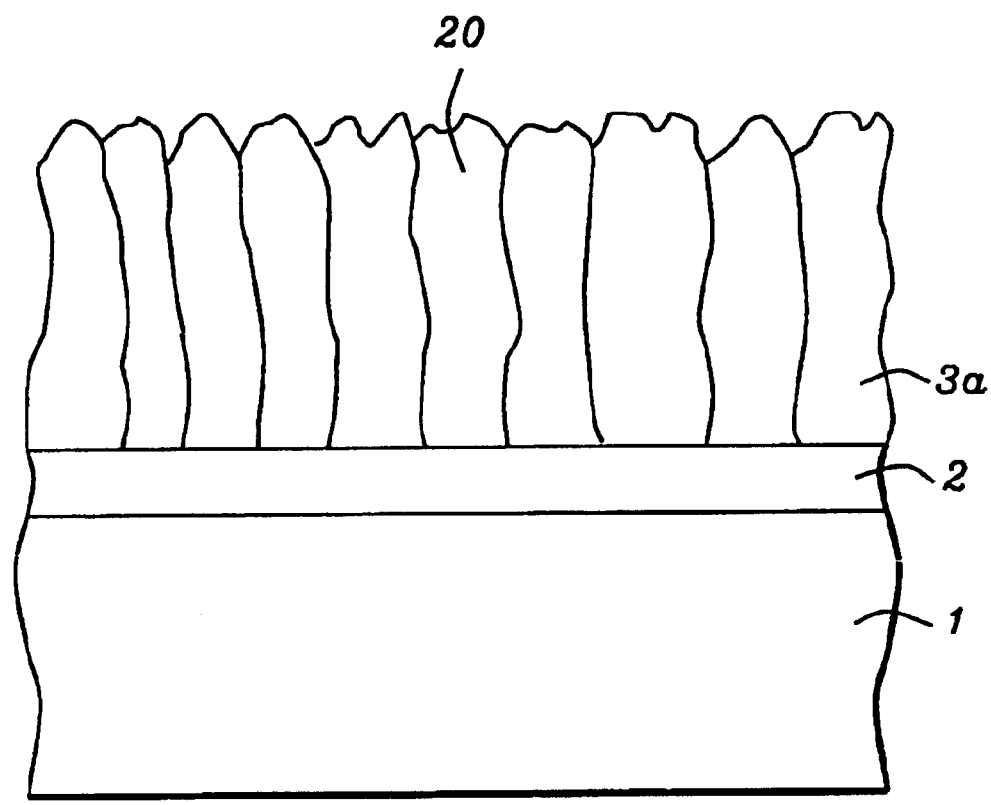
FIGS. 1B, 2B, 4B, and 5B, which schematically in cross-sectional style, illustrate the type of grains, columnar or random, of the seed and capping polysilicon layers, at various stages of fabrication of the gate structure.

Polysilicon seed layer 3*a*, obtained using the deposition conditions described above, is formed with columnar grains 20, shown schematically in FIG. 1B. The presence of columnar type grains can present several disadvantages when used as a component of a gate structure. First the rough top surface of the columnar grained polysilicon layer results in difficulties in terms of line width control as well as in establishing end point control during a dry etch definition procedure. Secondly the columnar grains result in unwanted surface roughness at the polysilicon seed layer-gate insulator layer, adversely influencing carrier mobility. Thirdly the presence of columnar grains can result in vertical electric scattering, adversely influencing threshold voltage parameters.

Figure 2A:
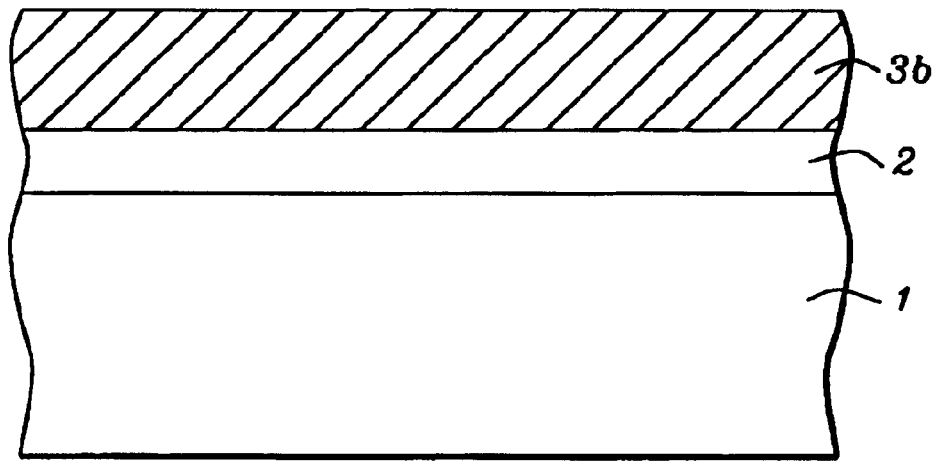
Figure 2B:
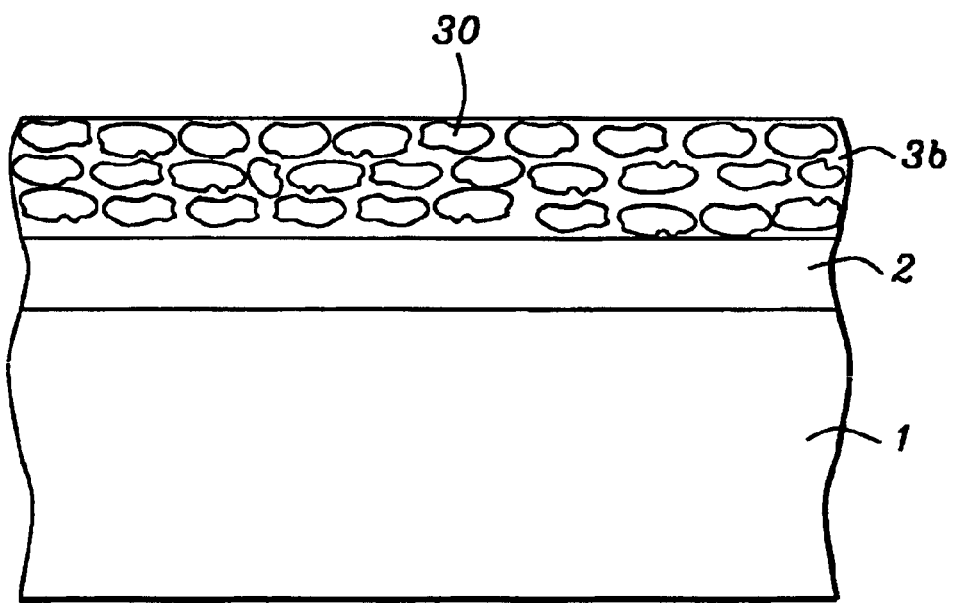

A process to alter the grain structure of polysilicon seed layer 3*a*, from a columnar grain layer to a random grain layer, comprised of small random polysilicon grains, is next addressed. An in situ anneal procedure is performed in the same furnace used for deposition of polysilicon seed layer 3*a*, at a temperature between about 600 to 660° C., in a hydrogen ambient, for a time between about 1 to 3 min. The anneal procedure converts large columnar grains 20, in polysilicon seed layer 3*a*, to small, random grains 30. Polysilicon seed layer 3*b*, shown schematically in FIG. 2A, now features smoother surfaces when compared to the rougher surfaces of pre-annealed, polysilicon seed layer 3*a*, thus decreasing vertical electric scattering, improving carrier mobility, as well as providing an easier layer to experience subsequent definition procedures. FIG. 2B, schematically illustrates polysilicon seed layer 3*b*, now comprised with small, random grains 30.

Figure 3:
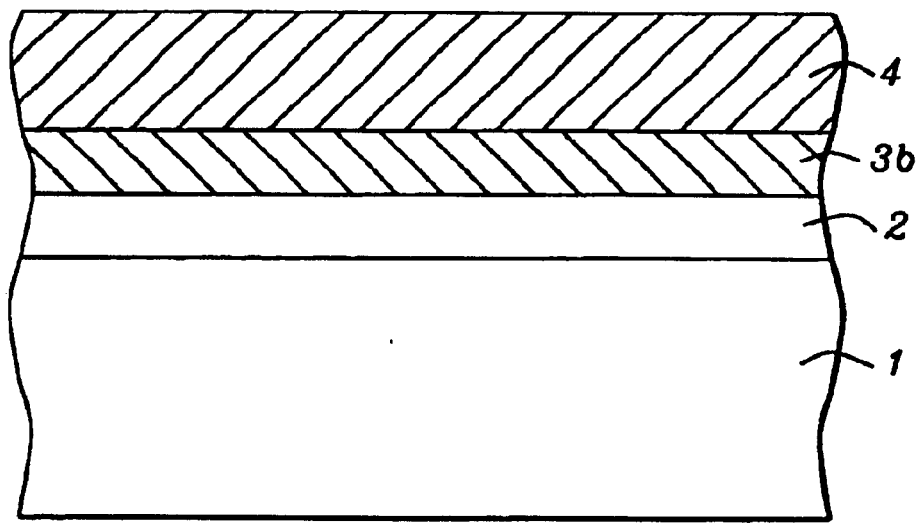

The next section of this invention addresses a polysilicon depletion effect (PED), which if polysilicon is used as a major component of the conductive gate structure, can adversely influence the activation of dopants in the gate structure. Inadequate dopant activation would result in undesired increases for gate sheet resistance, as well as resulting in the gate depletion effect evidenced by the gate voltage in addition to being applied to the underlying gate insulator layer, is also distributed across the polysilicon gate structure The addition of germanium in a polysilicon layer allows more robust activation of dopants in the defined polysilicon gate structure to be realized when compared to counterpart gate structures defined from only polysilicon layers. With the incorporation of germanium in the gate structure, allowing lower activation temperatures to be used, the work function, and thus device threshold voltage can be adjusted as a result of the amount of added germanium. Therefore polysilicon$_{(1-x)}$Ge$_x$ layer 4, is deposited at a thickness between about 500 to 1000 Angstroms, on underlying polysilicon seed layer 3*b*. The deposition of this layer is accomplished using LPCVD procedures at a temperature between about 580 to 620° C., using silane or disilane, and germane as sources for polysilicon and germanium. The germanium mole fraction (x), determined by the amount of injected germane, influences the work function and thus the threshold voltage of the MOSFET device. Polysilicon$_{(1-x)}$G$_x$ layer 4, is in situ doped during deposition via the addition of arsine, phosphine or diborane to the silane or disilane ambient. The result of this deposition is schematically shown in FIG. 3.

Figure 4A:
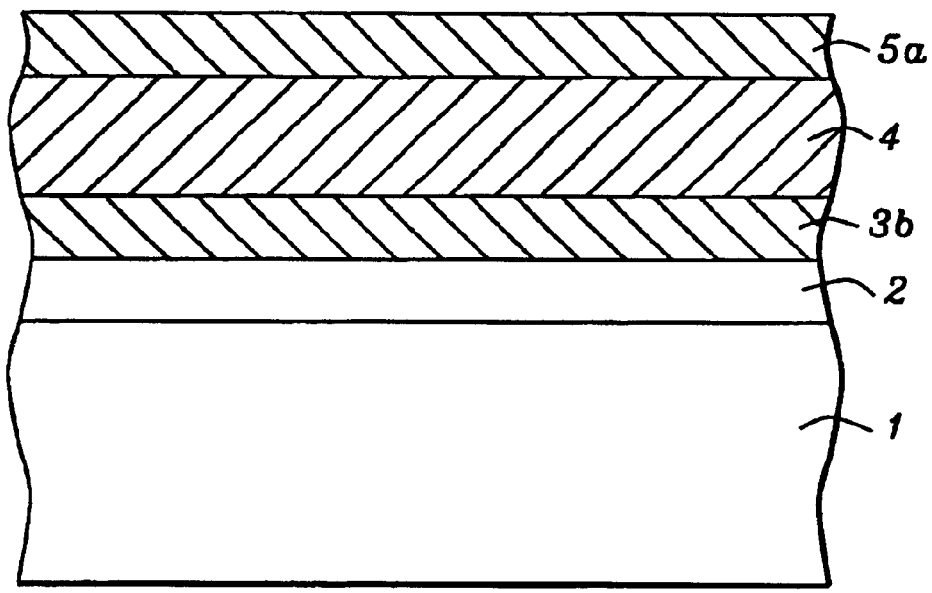
Figure 4B:
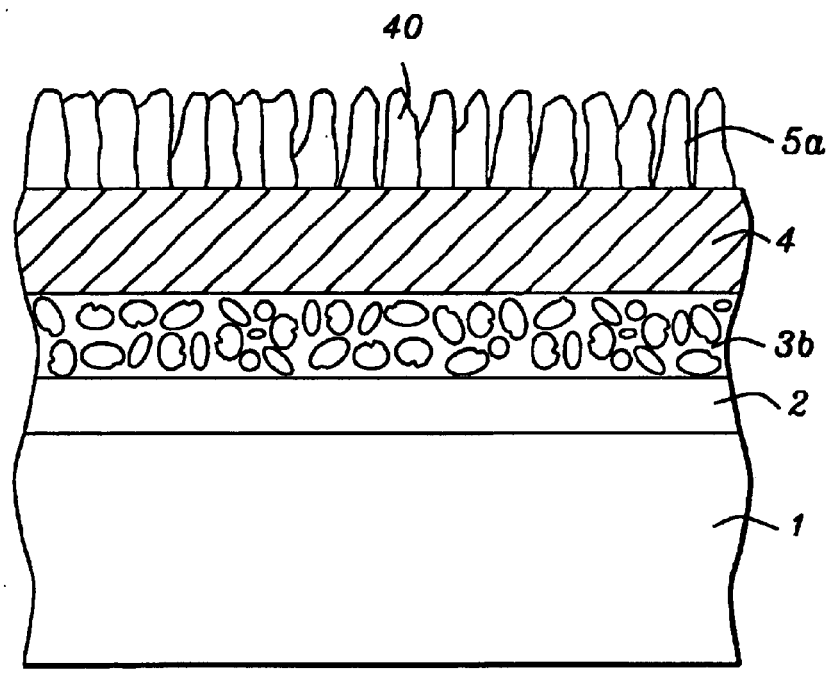

To reduce the risk of germanium outgassing, as well as to protect polysilicon$_{(1-x)}$Ge$_x$ layer 4, from subsequent metal silicide formation, an overlying polysilicon cap layer 5*a*, is deposited. Polysilicon cap layer 5*a*, is obtained at a thickness between about 500 to 1000 Angstroms via LPCVD procedures, performed at a temperature between about 600 to 660° C. Polysilicon cap layer 5A, is obtained using silane or disilane as a source for polysilicon, and if doping of this layer is desired, accomplished via the addition of arsine, phosphine, or diborane, to the silane or disilane ambient. This is schematically shown in FIG. 4A. As was the case for pre-annealed polysilicon seed layer 3*a*, polysilicon cap layer 5*a*, is formed with columnar grains 40, shown schematically in FIG. 4B.

Figure 5A:
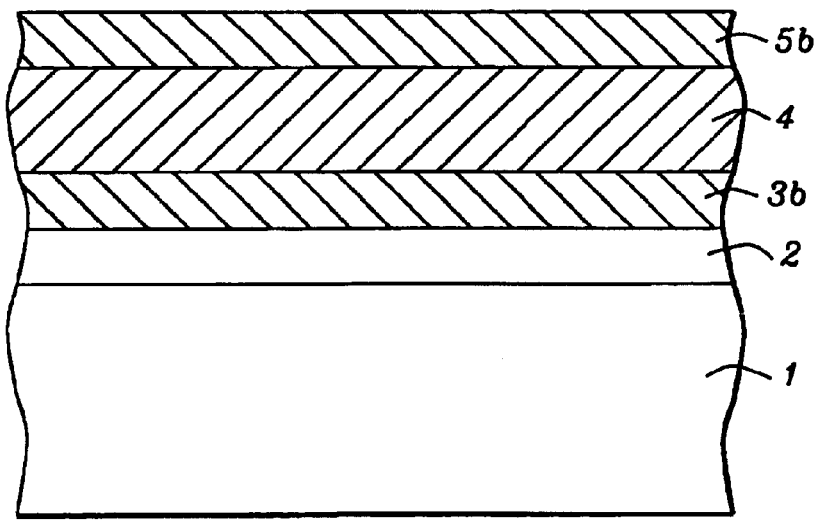
Figure 5B:
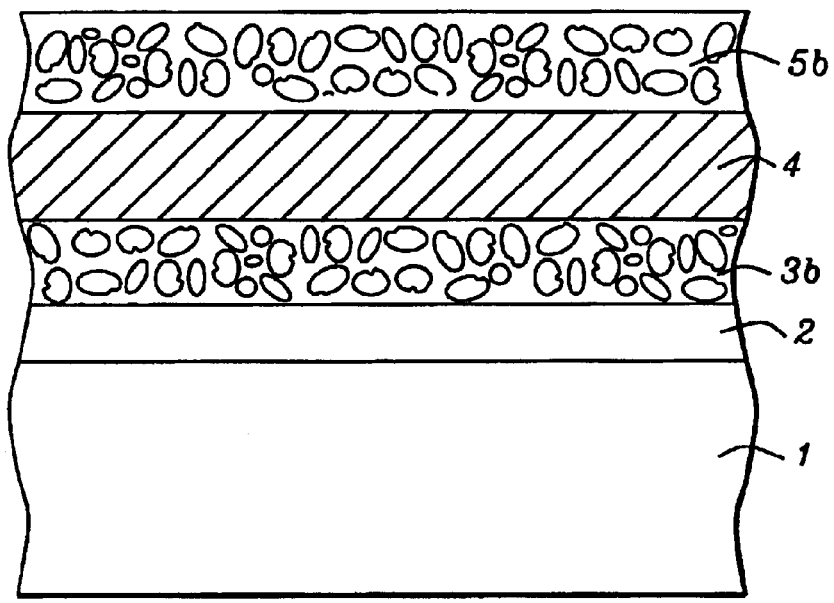

The presence of columnar grains 40, in polysilicon cap layer 5*a*, results in a rough top surface topography which reduces the ability to define narrow width gate structures in polysilicon cap layer 5*a*, via photolithographic and dry etching procedures. Therefore another low temperature anneal procedure, again performed in situ, in the same furnace used for deposition of polysilicon cap layer 5*a*, is performed to alter the columnar grain structure in polysilicon cap layer 5*a*, to a polysilicon layer comprised with smaller, random grains. The in situ anneal procedure is performed at a temperature between about 600 to 660° C., for a time between about 1 to 3 min, in a hydrogen ambient. The result of this procedure is the evolution of polysilicon cap layer 5*b*, schematically shown in FIG. 5A, now comprised with small, random grains 50, schematically shown in FIG. 5B. The in situ anneal procedure in addition to altering the grain structure of the polysilicon layer and providing a smooth surface for subsequent definition procedures, also allows activation of dopants in polysilicon$_{(1-x)}$G$_x$ layer 4, to occur. Without the presence of germanium in polysilicon$_{(1-x)}$Ge$_x$ layer 4, the activation of dopants would have had to be accomplished at a higher temperature then the in situ anneal temperature.

If desired the in situ anneal procedure applied after deposition of polysilicon seed layer 3*a*, can omitted, with the in situ anneal procedure performed after deposition of polysilicon cap layer 5*a*, used to alter the columnar grain structure of polysilicon layer 3*a*, to the random grain structure of polysilicon seed layer 3*b*.

Figure 6:
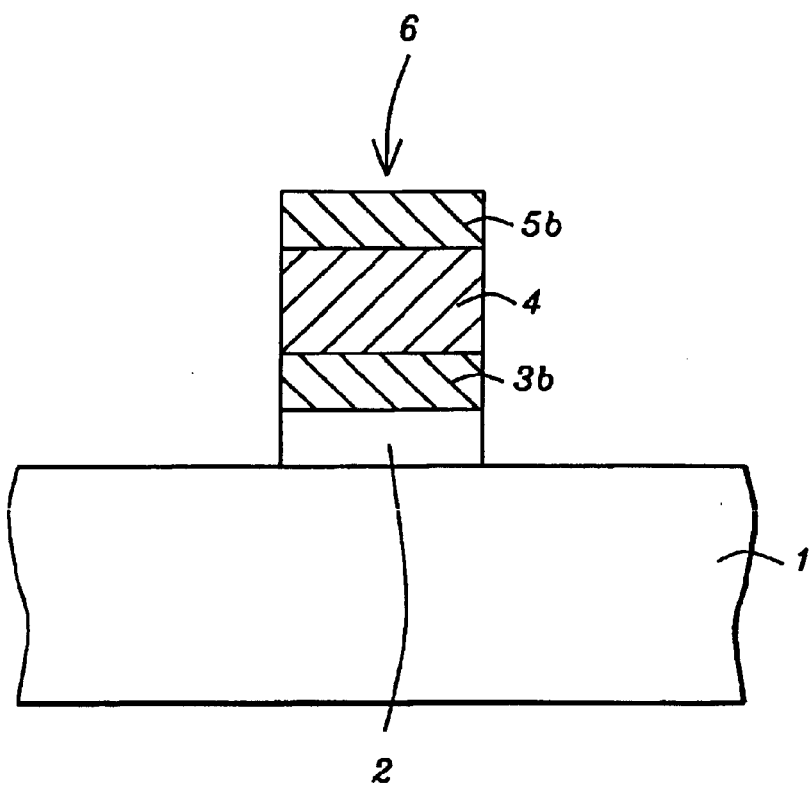

The definition of gate structure 6, comprised of polysilicon cap layer 5*b*, polysilicon$_{(1-x)}$Ge$_x$ layer 4, and polysilicon seed layer 3*b*, is next addressed and schematically illustrated in FIG. 6. A photoresist shape, not shown in the drawings, is used as a mask to allow an anisotropic reactive ion etching (RIE) procedure, using Cl$_2$ or SF$_6$ as an etchant to define gate structure 6. Gate structure 6, is defined with a width between about 0.09 to 0.24 um. After removal of the photoresist shape via plasma oxygen ashing procedures a wet clean procedure, comprised with a buffered hydrofluoric acid component, is employed resulting in removal of the portions of gate insulator layer 2, not covered by gate structure 6. The ability to define the narrow width of gate structure 6, was enhanced via the presence of the smooth surface of polysilicon cap layer 5*b*, while device characteristics such as carrier mobility was realized as a result of the smooth surfaces of polysilicon seed layer 3*b*, all obtained via low temperature anneal procedures, performed in situ in the same furnace used to deposit these polysilicon layers. In addition the ability to reduce polysilicon depletion was accomplished via the addition of germanium to the polysilicon layer 4, located between overlying polysilicon cap layer 5*b*, and underlying polysilicon seed layer 3*b*.

While this invention has been particularly shown and described with reference to, the preferred embodiments thereof, it will be understood by those skilled in the art that various changes in form and details may be made without departing from the spirit and scope of this invention.

What is claimed is:

1. A method of fabricating a gate structure for a metal oxide semiconductor field effect transistor (MOSFET) device, comprising the steps of:

forming a gate insulator layer on a semiconductor substrate;

forming a first semiconductor layer, comprised with a first grain structure, on said gate insulator layer;

performing an anneal procedure to convert said first grain structure to a second grain structure, resulting in an annealed first semiconductor layer comprised with said second grain structure;

forming a semiconductor alloy layer on said annealed first semiconductor layer;

forming a second semiconductor layer, wherein said second semiconductor layer, said semiconductor alloy layer, and said annealed first semiconductor layer constructing a gate layer; and patterning said gate layer to define a gate structure.

2. The method of claim 1, wherein said gate insulator layer is a silicon dioxide layer, thermally grown at a thickness between about 17 to 35 Angstroms.

3. The method of claim 1, wherein said first semiconductor layer is a polysilicon layer, obtained via low pressure chemical vapor deposition (LPCVD) procedures, at a thickness between about 50 to 300 Angstroms, using silane or disilane, and hydrogen as reactants.

4. The method of claim 1, wherein said first semiconductor layer is an undoped polysilicon layer.

5. The method of claim 1, wherein said first semiconductor layer is a doped polysilicon layer, doped in situ during deposition via the addition of arsine, phosphine, or diborane to a silane or disilane ambient.

6. The method of claim 1, wherein said first grain structure of said first semiconductor layer is a columnar grain structure.

7. The method of claim 1, wherein said anneal procedure is performed in situ, in the same furnace used to deposit said first semiconductor layer, carried out in a hydrogen ambient, at a temperature between about 600 to 660° C., for a time between about 1 to 3 min.

8. The method of claim 1, wherein said grain structure of said annealed first semiconductor layer, is a random grain structure.

9. The method of claim 1, wherein said semiconductor alloy layer is a polysilicon$_{(1-x)}$Ge$_x$ layer, wherein the content (x) of germanium, described as mote fraction, is between about 0.2 to 0.8.

10. The method of claim 1, wherein said semiconductor alloy layer is a polysilicon$_{(1-x)}$Ge$_x$ layer, obtained via LPCVD procedures at a thickness between about 500 to 1000 Angstroms, using silane or disilane as a source for polysilicon, while using germane as a germanium source.

11. The method of claim 1, wherein said semiconductor alloy layer is a polysilicon$_{(1-x)}$Ge$_x$ layer, in situ doped during deposition via the addition of arsine, phosphine, or diborane, to a silane or disilane, and germane ambient.

12. The method of claim 1, wherein said second semiconductor layer is a polysilicon layer, obtained via low pressure chemical vapor deposition (LPCVD) procedures, at a thickness between about 500 to 1000 Angstroms, using silane or disilane, and hydrogen as reactants.

13. The method of claim 1, wherein said second semiconductor layer is an undoped polysilicon layer.

14. The method of claim 1, wherein said second semiconductor layer is a doped polysilicon layer, doped in situ during deposition, via the addition of arsine, phosphine, or diborane to a silane or disilane ambient.

15. The method of claim 1, wherein said grain structure of said second semiconductor layer, is a columnar grain structure.

16. The method of claim 1, wherein said semiconductor layer is annealed, performed in situ, in the same furnace used to deposit said second semiconductor layer, carried out in a hydrogen ambient, at a temperature between about 600 to 660° C., for a time between about 1 to 3 min.

17. The method of claim 1, wherein said grain structure of said second semiconductor layer, is random grain structure.

18. A method of forming a gate structure for a MOSFET device, comprising the steps of:

forming a gate dielectric layer on a semiconductor substrate;

forming a first polysilicon layer on said gate dielectric layer, wherein said first polysilicon layer is comprised with columnar grains;

performing a first in situ anneal procedure resulting in an in situ annealed first polysilicon layer, now comprised with random grains;

forming a polysilicon-germanium layer on said in situ annealed first polysilicon layer;

forming a second polysilicon layer on said polysilicon-germanium layer, wherein said second polysilicon layer is comprised with columnar grains;

performing a second in situ anneal procedure resulting in an in situ annealed second polysilicon layer, now comprised with random grains; and performing a patterning procedure to define said gate structure, comprised of an overlying polysilicon cap layer obtained from definition of said in situ annealed second polysilicon layer, comprised of a polysilicon-germanium component obtained via definition of said polysilicon-germanium layer, and comprised of an underlying polysilicon seed layer obtained via definition of said in situ annealed first polysilicon layer.

19. The method of claim 18, wherein said first polysilicon layer is obtained via low pressure chemical vapor deposition (LPCVD) procedures, at a thickness between about 500 to 1000 Angstroms, using silane or disilane, and hydrogen as reactants.

20. The method of claim 18, wherein said first polysilicon layer can be an undoped layer, or a doped layer, in situ doped during deposition of said first polysilicon layer via the addition of arsine, phosphine, or diborane to a silane or disilane ambient.

21. The method of claim 18, wherein said first in situ anneal procedure is performed in a same furnace used to deposit said first polysilicon layer, performed in a hydrogen ambient, at a temperature between about 600 to 660° C., for a time between about 1 to 3 min.

22. The method of claim 18, wherein said polysilicon-germanium layer, denoted as polysilicon$_{(1-x)}$Ge$_x$ layer, wherein the content (x) of germanium described as mole fraction is between about 0.2 to 0.8.

23. The method of claim 18, wherein said polysilicon-Ge layer is obtained via LPCVD procedures at a thickness between about 500 to 1000 Angstroms, using silane or disilane as a polysilicon source, and using germane as a germanium source.

24. The method of claim 18, wherein said polysilicon-Ge layer is in situ doped during deposition via the addition of arsine, phosphine, or diborane, to a silane or disilane, and germane ambient.

25. The method of claim 18, wherein said second polysilicon layer is obtained via low pressure chemical vapor deposition (LPCVD) procedures, at a thickness between about 500 to 1000 Angstroms, using silane or disilane, and hydrogen as reactants.

26. The method of claim 18, wherein said second polysilicon layer can be an undoped layer, or said second polysilicon layer can be in situ doped during deposition, via the addition of arsine, phosphine, or diborane to a silane or disilane ambient.

27. The method of claim 18, wherein said second in situ anneal procedure is performed a same furnace used to deposit said second polysilicon layer, performed in a hydrogen ambient, at a temperature between about 600 to 660° C., for a time between about 1 to 3 min.

* * * * *